United States Patent [19]
Hoang

[11] Patent Number: 5,852,578
[45] Date of Patent: Dec. 22, 1998

[54] FLASH CELL HAVING SELF-TIMED PROGRAMMING

[76] Inventor: Loc B. Hoang, 5253 Rooster Dr., San Jose, Calif. 95136

[21] Appl. No.: 877,038

[22] Filed: Jun. 17, 1997

[51] Int. Cl.$^6$ .................................................. G11C 16/00
[52] U.S. Cl. ................................ 365/185.28; 365/185.21
[58] Field of Search ......................... 365/185.28, 185.18, 365/185.21, 185.22, 185.24

[56] References Cited

U.S. PATENT DOCUMENTS

| | | | |
|---|---|---|---|
| 4,794,564 | 12/1988 | Watanabe | 365/185.28 |
| 5,200,919 | 4/1993 | Kaya | 365/185.28 |
| 5,566,111 | 10/1996 | Choi | 365/185.21 |
| 5,754,472 | 5/1998 | Sim | 365/185.28 |

*Primary Examiner*—Tan T. Nguyen
*Attorney, Agent, or Firm*—Proskauer Rose LLP

[57] ABSTRACT

A cell grid includes a plurality of cells in which at least one cell at a time is selected for programming. The programming cycle of each cell is self-timed so that once the actual programming process ends (i.e., an adequate number of electrons have injected through to the floating gate), programming is complete. Each cell in the cell grid has a source, a drain, a floating gate and a control gate. At least one bit line is included in the cell grid and is connected to the drains of corresponding cells including the selected cell. Further, at least one write line is included and is connected to the control gates of corresponding cells, so that one of the at least one write lines supplies a main voltage for maintaining the selected cell in an on-state during programming of the selected cell. At least one source line is included and is connected to the sources of each corresponding cell, so that one of the source lines supplies the necessary voltage required for programming of the selected cell and also supplies the main current source of the selected bit line during programming of the selected cell. An auxiliary transistor is coupled to each corresponding bit line and supplies an auxiliary current source to the selected bit line and maintains the remaining non-selected cells on the same selected bit line in the off-state during programming. A detection circuit is coupled to each corresponding auxiliary transistor and detects when the programming is complete by detecting a current source change between the main current and the auxiliary current source over time.

11 Claims, 5 Drawing Sheets

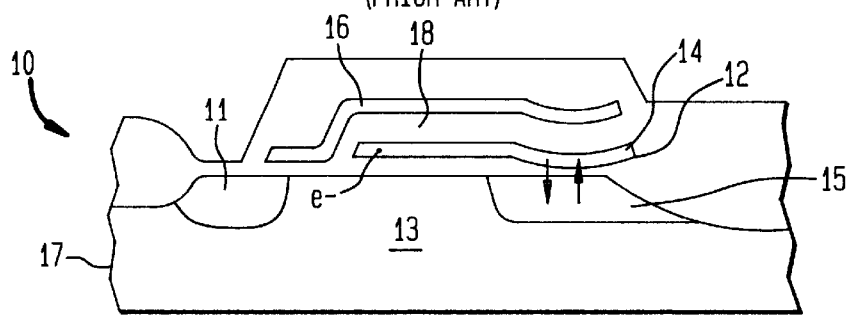
FIG. 1 (PRIOR ART)
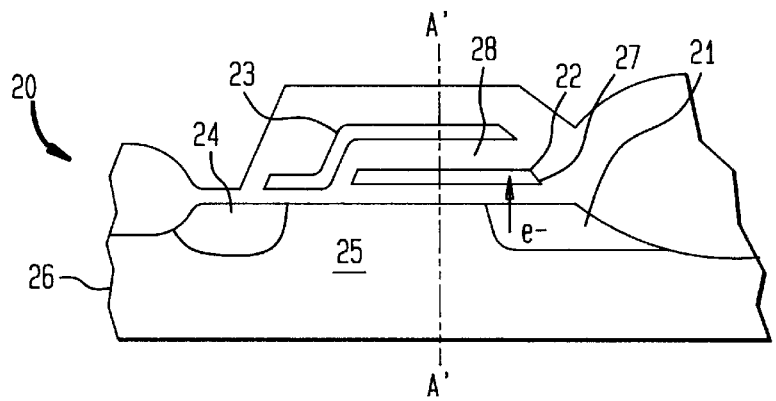
FIG. 2A (PRIOR ART)
FIG. 2B (PRIOR ART)
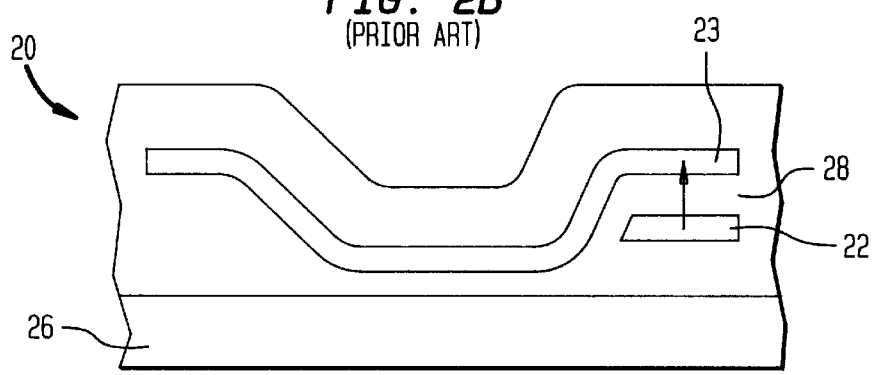
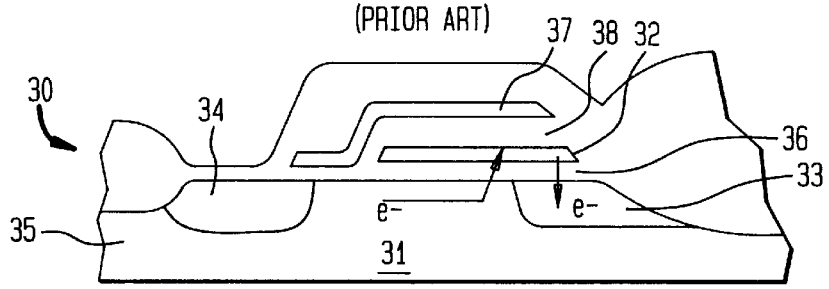
FIG. 3 (PRIOR ART)

FLASH CELL HAVING SELF-TIMED PROGRAMMING

FIELD OF THE INVENTION

The present invention relates generally to a memory cell and, more particularly, to a memory flash cell that has self-timed programming for reducing the programming time of each selected cell, and a process for programming the same.

BACKGROUND OF THE INVENTION

A floating gate erasable memory flash cell typically includes a field effect transistor, a floating gate positioned above the channel of the field effect transistor, and a select or control gate positioned at least partly over the floating gate. The floating and control gates are often made of poly-silicon. As indicated by its name, the floating gate is electrically isolated. For instance, the floating gate may be formed so that it is completely surrounded by oxide regions and layers. The cell is programmed by charging and discharging the floating gate.

Three classic programming mechanisms for floating gate erasable memories are Fowler-Nordheim (FN) tunneling, enhanced FN tunneling and channel hot electron (CHE) injection. See H. MAES, J. WITHERS & G. GROESENEKEN, Trends in Non-volatile Memory Devices and Technologies", SOLID STATE DEVICES page 157–168 (1988). In FN tunneling, electrons tunnel from a Si region through an oxide layer (such as an $SiO_2$ layer which insulates the floating gate) and into the floating or control gate. Typically, a 10 Mega Volt/cm field is required to narrow the $Si$—$SiO_2$ barrier so that electrons can tunnel from the Si conduction band into the $SiO_2$.

In enhanced FN tunneling, electrons tunnel from a poly silicon region through a textured poly oxide layer and into the floating or control gate. The poly silicon region from which the electrons tunnel has particles with asperities (pointed particles) at the poly silicon/poly oxide interface. The asperities enhance the field at the interface between the poly silicon region from which the electrons tunnel and the poly oxide layer through which the electrons tunnel. Thus, average fields on the order of 2 Mega Volts/cm produce a field on the order of 10 Mega Volts/cm at the poly silicon/poly oxide interface. However, this enhancement is only provided for one tunneling direction, namely, the direction in which the asperities of the poly silicon point.

Channel hot electrons can be created in a high electric field near a drain junction. Such channel hot electrons can be injected from the channel into a floating gate. However, CHE cannot be used to remove electrons from a floating gate.

FIGS. 1–7 show seven conventional flash $E^2PROM$ (electrically erasable programmable read-only memory) cell architectures 10, 20, 30, 40, 50, 60, and 70 showing the different possible combinations of the above three programming mechanisms. Conventionally, many trade-offs are made in the design of flash memory $E^2PROM$ cells. Some cells are very simple to manufacture but are very large or difficult to scale. Other cells require only a low programming power (low power to write or erase information stored in a cell) but require more than one programming mechanism.

The floating gate tunnel oxide (FLOTOX) cell 10 is shown in FIG. 1 comprising a source 11, a drain 15, and a channel 13 formed in a substrates 17. A gate oxide 12 is formed on the channel 13 and a floating gate 14 is formed on the gate oxide 12. An oxide layer 18 is formed on the floating gate 14 and a control gate 16 is formed on the oxide layer 18. In a write operation (storing electrons in the floating gate 14), electrons tunnel according to FN tunneling from the drain 15, through the thin oxide layer 12, to the floating gate 14. In an erase operation (removing electrons from the floating gate 14) electrons tunnel according to FN tunneling from the floating gate 14, through the thin oxide layer 12, to the drain.

The textured poly oxide-thin oxide (Tex-Thinox) cell 20 is shown in FIGS. 2A and 2B (FIG. 2B shows a cross-section along the line A—A'). A drain 21, a source 24 and a channel 25 are formed in a substrate 26. A poly oxide 27 is formed on the channel 25 and a poly silicon floating gate 22 is formed on the poly oxide 27. An oxide 28 is formed on the floating gate 22 and a control gate 23 is formed on the oxide 28. Writing is achieved by enhanced FN tunneling from drain 21, through the poly oxide 27, to floating gate 22 as shown in FIG. 2A. Erasing is achieved by FN tunneling from floating gate 22, through the oxide 28, to control gate 23 as shown in FIG. 2B.

The channel hot electron-thin oxide (CHE-Thinox) cell 30 is shown in FIG. 3 including a source 33, channel 31 and drain 34 formed in a substrate 35. A gate oxide 36 is formed on the channel 31 and a floating gate 32 is formed on the gate oxide 36. A control gate 37 is formed on an oxide layer 38 which, in turn, is formed on the floating gate 32. Writing is achieved by injection of channel hot electrons from the channel 31, across the gate oxide 36 and into the floating gate 32. Erasing is achieved by FN tunneling from the floating gate 32, through the gate oxide 36, to the source 33.

The Thinox-Tex cell 40 is shown in FIG. 4. The Thinox-Tex cell 40 includes a source 44, a channel 41 and a drain 45 formed in a substrate 46. A gate oxide 47 is formed on the channel 41 and a poly silicon floating gate 42 is formed on the gate oxide 47. A poly oxide layer 48 is formed on the floating gates 42. A sidewall gate 43 and control gate 49 are formed on the poly oxide layer 48. Writing is achieved by FN tunneling from channel 41, through the gate oxide 47, to floating gate 42. Erasing is achieved by enhanced FN tunneling from floating gate 42, through the poly oxide 48, to sidewall gate 43.

The textured poly floating gate (TPFG) cell 50 is shown in FIG. 5. The TPFG cell 50 has a source 54, a channel 57 and a drain 56 formed in a substrate 52. A sidewall gate 51, a floating gate 53 and a control gate 55 are formed in a thick poly oxide 58. Writing is achieved by enhanced FN tunneling from the side wall gate 51, through the poly oxide 58, to the floating gate 53. Erasing is achieved by enhanced FN tunneling from the floating gate 53, through the poly oxide 18, to the control gate 55.

The CHE-Tex cell 60 is shown in FIG. 6. The CHE-Tex cell 60 includes a source 64, a drain 65 and a channel 66 formed in a substrate 61. A gate oxide 67 is formed on the channel and a poly silicon floating gate is formed on the gate oxide 67. A poly oxide layer 68 is formed on the floating gate and a control gate 63 is formed on the poly oxide layer 68. Writing is achieved by CHE injection from the channel 66, across the gate oxide 67, and into the floating gate 62. Erasing is achieved by enhanced FN tunneling from the floating gate 62, through the poly oxide layer 68, to the control gate 63.

FIG. 7 shows a perpendicularly accelerating channel injection metal oxide semiconductor (PACMOS) cell 70. The PACMOS cell has a source 71, a drain 72 and a channel 73 formed in a substrate 79. A gate oxide layer 78 is formed over the channel 73 and a poly silicon floating gate 74 is formed on the gate oxide layer 78. A second oxide layer 75 is formed on the poly silicon floating gate 74 and a metal control gate 76 is formed over a portion of the second oxide layer 75 so that it partially overlaps the floating gate 74 and the drain portion of the channel 77 at which the hot electrons are generated. Writing is achieved by applying a voltage to the control gate 76 which is close to the threshold voltage and simultaneously biasing the floating gate 74 with a high voltage (via capacitive coupling from the drain 72). As a result, a strong potential drop occurs at the center of the channel 73 where neither of the gates 74 or 76 are controlling the channel 73. This provides a very efficient injection of CHE at the channel center, i.e., with an efficiency of $10^{-3}$, i.e. approximately one out of every thousand electrons are injected. Erasing is achieved by FN tunneling from the poly floating gate 74 through the second oxide layer 75 to the source 71.

All of the above described floating gate cells of FIGS. 1–7 are typically formed in a grid cell, as shown in FIG. 8. Grid cell 80 comprises four memory cells FG1, FG2, FG3, FG4. Cells FG1 and FG3 are in series along bit line 81 and cells FG2 and FG4 are in series along bit line 83. Further, write lines (i.e., word lines) WL1 82 and WL2 84 are connected to the control gates of cells FG1, FG2 and FG3, FG4, respectively. It should be understood that additional rows and columns of cells and bit, source and write lines may be added or deleted, as desired. Further, in this example cell FG3 (circled) is selected for programming. Therefore, only selected WL2 84 will be supplied with a voltage to act as a main voltage source, as will be described below.

As described above, each cell includes a source, a drain, a floating gate 90, and a control gate 92, as shown in FG3. Typically, there are two modes of operation for each cell, 'selected' and 'deselected'. In the 'selected' mode, a cell may be programmed, read or erased. In addition, at least one cell on the same selected write line in each cell grid may be programmed at any one time. Therefore, it is important to ensure that only the cell to be programmed is 'selected' and that every other cell in the grid is 'deselected'.

Voltage is selectively supplied across each bit line 81, 83 via a Vcc coupled to the gate of transistors T1, T2, respectively. As will be described in greater detail below, voltage of Vcc-Vt is supplied to each bit line that is not coupled to the selected cell (the cell being programmed). Further, a voltage source applied to source line 86, parallel to the write lines 82, 84, is connected to the source of cells FG1, FG2, FG3, FG4 for supplying a voltage thereto. Of course, if additional rows and columns of cells were added in grid 80, additional source lines, write lines and bit lines would be added as well. Source line 86 acts as a main voltage source to provide the voltage necessary for the effect of channel hot electron injection. As discussed above, a high electric field is required to cause the channel hot electrons effect from the channel to the floating gate which occurs during programming in several of the cells discussed above. In this example, it will be assumed that a high electric field across the channel is also required. Thus, 12 volts is chosen to be applied to source line 86 to ensure channel hot electron injection. Of course, this amount can be varied, as desired.

In addition, coupled to each bit line 81, 83 is a biasing transistor T5, T6, and an auxiliary transistor T3, T4, respectively. Auxiliary transistors T3, T4 act as an auxiliary current source (supplementing the main current source 86), as will be discussed below. Voltages Vcc and Vpullup are coupled to the drain and gate of each auxiliary transistor, along lines 85 and 87, respectively, for providing a voltage to bias the output from the respective auxiliary transistors at nodes 94 and 96. Since 0 volt (GND) is applied to T1 on bit line 81 to GND (95), auxiliary transistor T3 outputs a voltage so that node 94 (having the same potential as bit line 81) is more positive than point 95 (GND). In addition, a voltage bias Vbias from a current reference source (not shown) is supplied to the gate of transistor T5 on the selected bit line across line 89 to provide a constant current sink Iprog through T5 from BL. 81 to point 95 (GND), while the gate of transistor T6, along the non-selected bit line, is grounded.

In operation, suppose that a logic '0' is to be written (i.e., electrons injected into the floating gate) into the selected cell FG3 (circled). Thus, the selected source line 86 is supplied with 12 volts. Typically, 2 volts would be applied to the selected write line WL2 84 which, as stated, acts as the main voltage source for maintaining the selected cell in an "on-stage" during programming. Zero volts is applied to the unselected write line, i.e. WL1 82. Thus, the voltage level of the control gates of cells FG1, FG2 is zero.

To turn off the non-selected cells that are coupled to the selected write line WL2, i.e. cell FG4, a voltage of approximately 4 volts is supplied to bit line 83 through transistor T2 (assuming Vcc equals 5 Volts and the threshold voltage Vt of T2 is about 1V). Thus, although 12 volts is supplied to the source of FG4, the 4 volts supplied to the drain of FG4 will prevent any current from flowing through FG4 since the control gate of FG4 is at only 2V. Further, since 4 volts are applied to the drain and zero volts are applied to the control gate of cell FG2, FG2 is off. This occurs since the voltage on the drain is greater than the voltage on the gate.

Since 12 volts are applied to the source of the selected cell FG3 when programming begins, hot electrons from the channel begin injecting through to the floating gate 90. As is known with NMOS transistors, such as cells FG1–FG4 (assuming that the Vt of such cell is about 1 Volt after it is erased), a 1 volt threshold drop will occur so that, although 2 volts are supplied to the control gate 92 from WL2, only 1 volt is applied to node 91 on bit line 81. Since bit line 81 has 1 volt, the drain of FG1 is supplied with 1 volt. Therefore, the drain voltage of 1 volt is greater than the control gate voltage of 0 volts, so that cell FG1 is off as well.

At this point, only cell FG3, the selected cell, is on. As programming of cell FG3 proceeds, more negative charge is stored in floating gate 90 as more electrons are injected. In turn, the threshold Vt of FG3 increases. At some point near the end of programming, the bit line voltage can drop to 0 volts. If this occurs, the drain and control gate of FG1 will both have a 0 voltage level, while the source has a higher voltage level of 12 volts. This occurrence may cause FG1 to turn on. For example, if some noise from the source enters the control gate, the gate voltage may increase so that it is higher than the drain voltage. If this occurs, FG1 will turn on.

To avoid this occurrence, a voltage of about 1.5 volts is applied to the Vpullup of transistor T3 along line 87 during the entire write cycle. Due to the threshold drop, a voltage of 0.5 volts is supplied to bit line 81 and the Vpullup to T3 acts as an auxiliary current source. In this manner, the drain voltage of FG1 should always be higher than the control gate voltage.

However, in this programming scheme, the voltage signals applied to WL2, Source, Vbias and Vcc, are all timer controlled based on the same predetermined $\Delta t$. $\Delta t$ is merely an estimated amount of time and does not take onto account changing tolerances and parameters of each individual cell.

For example, after a cell is programmed, the parameters of each new cell changes, i.e. no two cell parameters are the same. Further, since Δt is typically overcompensated to ensure that each cell will be properly programmed, high voltage 'HV' stresses may occur due to the extended duration of applying 12 volts through the source line. When an HV stress occurs, the stored values of the neighboring cells may be disturbed.

It is therefore an object of the present invention to overcome the disadvantages of the prior art.

SUMMARY OF THE INVENTION

This and other objects are achieved by the present invention. According an embodiment, a cell grid includes a plurality of cells in which at least one cell on the same selected write line is selected for programming. The programming cycle of each cell is self-timed so that the once the actual cell programming process ends (i.e., an adequate number of electrons have injected through to the floating gate), the programming cycle is complete.

Each cell in the cell grid has a source, a drain, a floating gate and a control gate. At least one bit line is included in the cell grid and is connected to the drains of corresponding cells including the selected cell. At lease one common source line is included and is connected to the sources of each corresponding cell, so that one of the common source lines supplies a main current and voltage as required for the selected cells in programming (i.e., channel hot electron injection). Further, at least one write line is included and is connected to the control gates of corresponding cells, so that one of the at least one write lines supplies a main voltage for maintaining the selected cell in an on-state during programming of the selected cell. An auxiliary transistor is coupled to each corresponding bit line and supplies an auxiliary current source for maintaining the non-selected cell on the selected bit line in the off-state during programming.

A detection circuit is coupled to each corresponding bit mine and detects when the programming is complete by detecting a current source change between the main current source through the selected memory cell and the auxiliary current source through the corresponding auxiliary transistor over time. The detection circuit may include a current mirror coupled to the auxiliary transistor, a threshold current source and an invertor. In addition, the detection circuit may be an e configuration which detects the current source change.

The present invention accommodates a wide range of processing variations dynamically, instead of having a single estimated at attempting to accommodate every cell situation. The detection circuit ensures that the programming will not end prematurely, as well as reducing high-voltage stress on neighboring cells.

BRIEF DESCRIPTION OF THE DRAWINGS

The following detailed description, given by way of example and not intended to limit the present invention solely thereto, will best be understood in conjunction with the accompanying drawings in which:

FIG. 1 shows a conventional FLOTOX cell.

FIGS. 2A–2B show a conventional Tex-Thinox cell.

FIG. 3 shows a conventional CHE-Thinox cell.

DETAILED DESCRIPTION OF THE INVENTION

Figure 4:
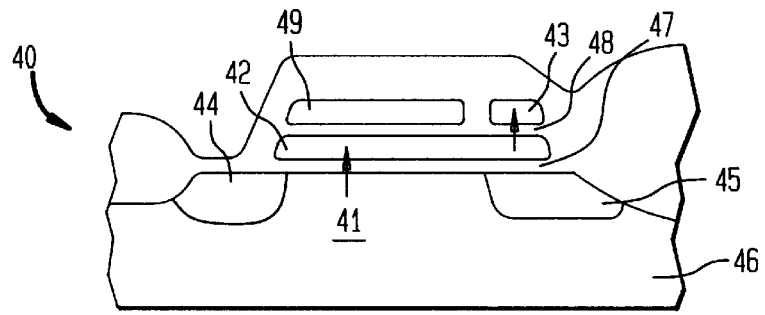
FIG. 4 shows a conventional Thinox-Tex cell.
Figure 5:
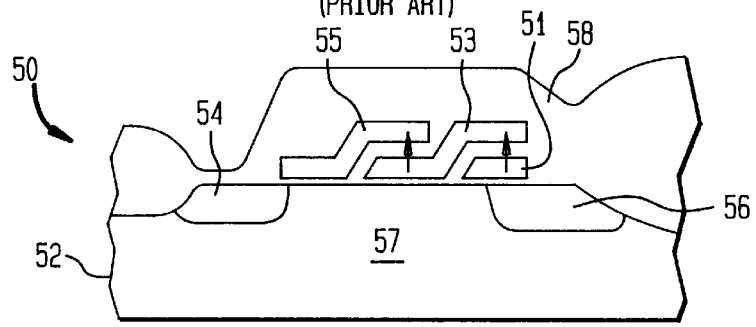
FIG. 5 shows a conventional TPFG cell.
Figure 6:
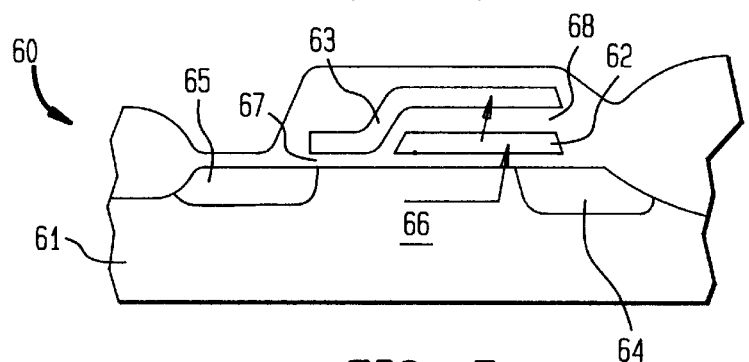
FIG. 6 shows a conventional CHE-Tex cell.
Figure 7:
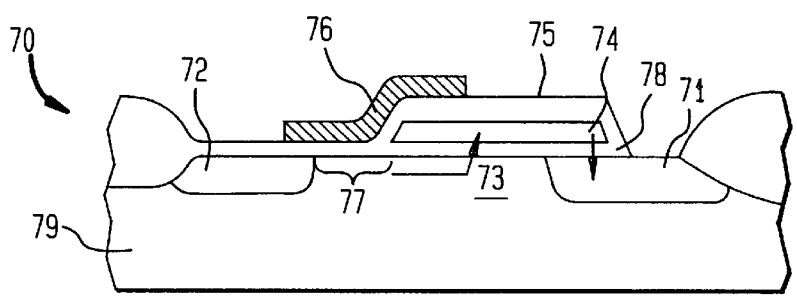
FIG. 7 shows a conventional PACMOS cell.
Figure 8:
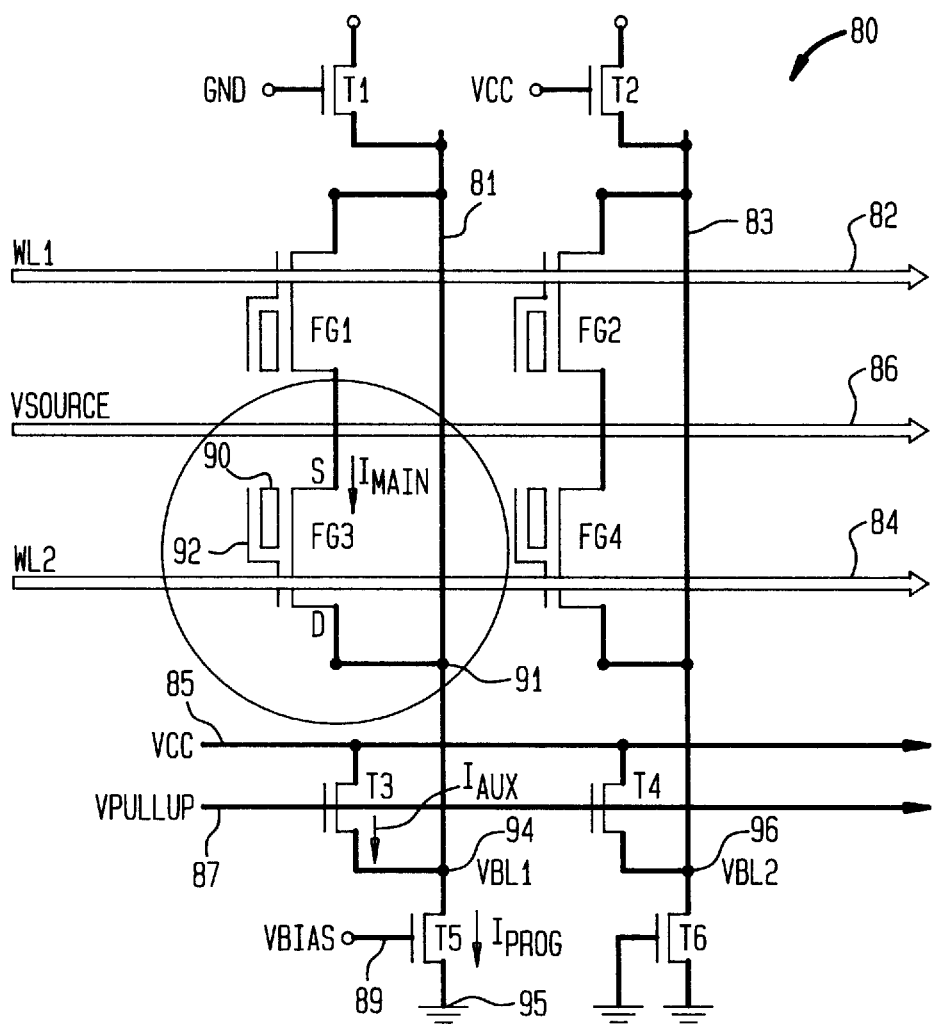
FIG. 8 shows a conventional cell grid.
Figure 9:
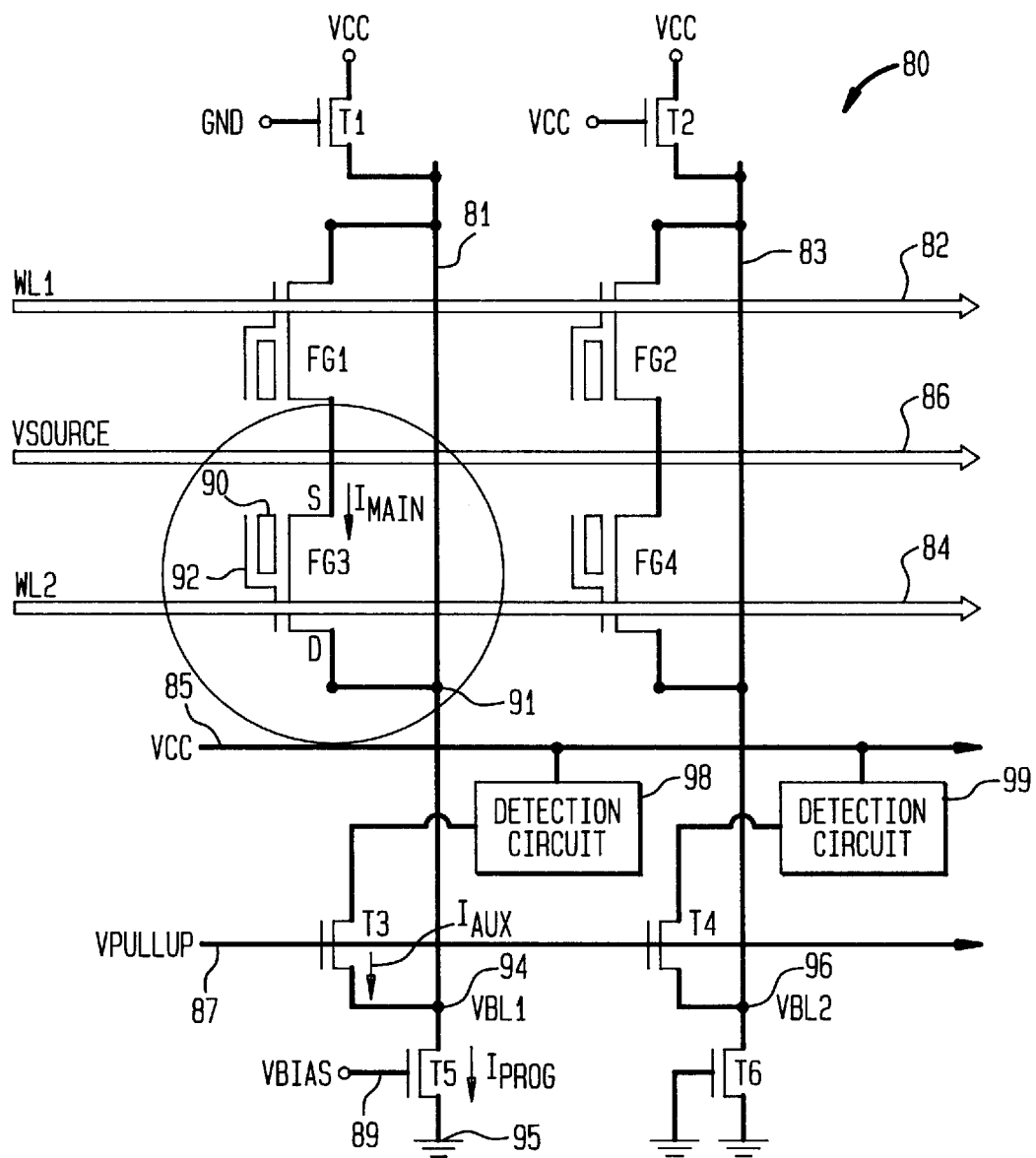
FIG. 9 shows detection circuits in accordance with the present invention.

As illustrated in FIG. 9, a detection circuit, coupled to each bit line, may be selectively activated to detect the current source change over time between the main current source from Vsource on line 86 through FG3 and the auxiliary current source from Vcc through T3, via P1 of the detection circuit, to the biasing transistor T5. The detection circuits 98, 99 eliminate the inaccurate reliance on an estimated and typically overcompensated Δt, discussed above.

Since the voltage threshold level of the selected cell FG3 increases over time (as more electrons inject through to the floating gate), the role of Vsource as the main current source diminishes. There will be a point when the current through transistor T3 accounts for the majority of the biasing current $I_{PROG}$ flowing through T5 to GND. For example, it may be that the programming cycle is known to be complete when the current through transistor T3 equals 95% of the total biasing current $I_{PROG}$. Accordingly, when a detection circuit, coupled to T3, detects that the current through T3 equals 95% Of $I_{PROG}$, the detection circuit indicates that programming is over. Thus, programming terminates precisely at the end of the write cycle.

Figure 10:
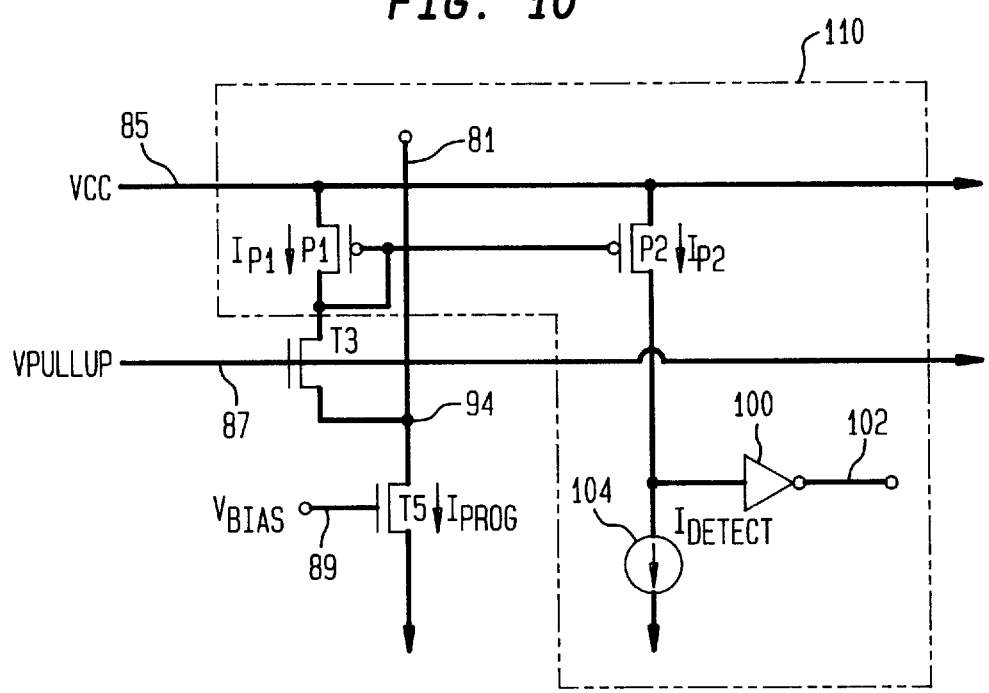
FIG. 10 shows a current mirror detection circuit in accordance with the present invention.

FIG. 10 shows an example of a detection circuit that can implement the self-timed programming scheme discussed above. Detection circuit 110 comprises a current mirror coupled to the drain of T3. Similarly, there will be a detection circuit coupled to auxiliary transistor T4 (not shown).

Specifically, transistors P1 and P2 form each leg of the current mirror and have currents $I_{P1}$, and $I_{P2}$, respectively, flowing therethrough. Current $I_{P1}$, in essence, takes on the current level of the current flowing through transistor T3 (which is supplied to the drain of T5). Therefore, the current level of $I_{P2}$ also equals the level of the current flowing through T3 (due to the current mirror configuration). Coupled to transistor P2 is a current source Idetect 104 and an invertor 100.

In operation, the current flow through T3 ramps up during the write cycle, as discussed above. Accordingly, $I_{P1}$, and similarly $I_{P2}$ proportionally increase, as well. Source Idetect 104 compares $I_{P2}$ with a known threshold level (e.g., 95% of $I_{PROG}$) to indicate when programming is complete. In this case, $I_{P2}$ reaches the threshold level of Idetect which is pulled down to, e.g. logic '0' initially. In turn, $I_{P2}$ drives the input of invertor 100 to logic '1'. The invertor then outputs an indication that programming is complete along line 102. Of course, other methods and configurations may be used in lieu of the circuit of FIGS. 9 and 10 to detect when the current through T3 equals or is greater than the threshold level percentage of $I_{PROG}$.

Accordingly, the detection circuit of the present invention does not have a predetermined write time since each cell being programmed is self-time. The programming time is shortened since the precise moment that programming is complete is detected, i.e. when $I_{P2}$ equals or is greater than the threshold. In other words, programming is complete when the current source changeover (from the main to the auxiliary source) occurs.

Therefore, the present invention may accommodate a wide range of processing variations dynamically, instead of having a single estimated Δt attempting to accommodate every cell situation. It ensures that the programming will not end prematurely, as well as reducing "HV" stress or disturb on neighboring cells.

Finally, the above-discussion is intended to be merely illustrative. Numerous other embodiments and equivalent structures may be devised by those having ordinary skill in the art without departing from the scope or spirit of the invention as defined in the appended claims.

What is claimed is:

1. A cell grid having a plurality of cells, at least one of which being selected for programming, each of said cells having a source, a drain, a floating gate and a control gate, comprising:

at least one bit line connected to the drain of corresponding said cells, wherein one of said at least one bit line is selected and connected to said drain of said selected cell;

at least one write line connected to the control gate of corresponding said cells, wherein one of said at least one write line is selected and supplies a main voltage source for maintaining said selected cell in an on-state during programming of said selected cell;

at least one source line connected to the source of corresponding said cells wherein one of said at least one source line is selected and supplies a voltage required for programming of said selected cell and being a main current source to the selected bit line during programming of said selected cell;

at least one auxiliary transistor, each coupled to a corresponding said at least one bit line, wherein one of said at least one auxiliary transistor being an auxiliary current source to the selected bit line and maintaining the remaining non-selected cells on the selected bit line in said off-state during programming of said selected cell;

at least one biasing transistor, each coupled to a corresponding said at least one bit line, wherein one of said at least one biasing transistor is selected for providing a constant current sink, coupled to the selected bit line, during programming of said selected cell; and at least one detection circuit, each coupled to a corresponding said at least one auxiliary transistor, for detecting when said programming is complete by detecting a current source change between said main current source and said auxiliary current source over time to the selected constant current sink, coupled to the selected bit line, during programming of said selected cell.

2. The grid cell of claim 1, wherein said main voltage source supplies a voltage to the control gate of said selected cell.

3. The grid cell of claim 1, wherein hot electrons from the channel of said selected cell are injected through to said floating gate when said source is supplied with at least a predetermined voltage level during programming of said selected cell.

4. The grid cell of claim 3, wherein the threshold voltage of said selected cell increases as the amount of negative charge on said floating gate increases.

5. The grid cell of claim 4, wherein the current level of said main current source decreases as said threshold voltage increase, and wherein the current level of said auxiliary current source increases as said current level of said main current source decreases.

6. The grid cell of claim 5, wherein said detecting circuit detects when the current of said auxiliary current source equals at least a predetermined percentage of the sum of the current of said auxiliary and main current sources.

7. The cell grid of claim 1, wherein said detecting circuit comprises a current mirror and a threshold current source for determining when the current level of said current mirror equals a predetermined percentage of the current level of the total current on the selected bit line.

8. A method of detecting when the programming of a selected cell, in a cell grid having a plurality of cells, is complete, comprising the steps of:

detecting when a current level of an auxiliary current source, supplied to a selected bit line is equal to a predetermined percentage of at least the sum of the current from a main and said auxiliary current sources; and outputting an indication that said programming of said selected cell is complete when said detection is made.

9. The method of claim 8, wherein said current level of said auxiliary current source is driven to said predetermined percentage over time during said programming.

10. The method of claim 8, wherein each of said cells in said cell grid includes a source, a drain, a floating gate and a control gate.

11. The method of claim 10, wherein said current level of said auxiliary current source increases to said predetermined percentage as the amount of negative charge in the floating gate of said selected cell increases.

* * * * *